United States Patent
Samanta

(10) Patent No.: US 12,007,424 B2
(45) Date of Patent: Jun. 11, 2024

(54) SUBSTRATE AND MATERIAL CHARACTERISATION METHOD AND DEVICE

(71) Applicant: SONY SEMICONDUCTOR SOLUTIONS CORPORATION, Atsugi (JP)

(72) Inventor: Kamal Samanta, Basingstoke (GB)

(73) Assignee: SONY SEMICONDUCTOR SOLUTIONS CORPORATION, Atsugi (JP)

( * ) Notice: Subject to any disclaimer, the term of this patent is extended or adjusted under 35 U.S.C. 154(b) by 234 days.

(21) Appl. No.: 17/441,039

(22) PCT Filed: Feb. 7, 2020

(86) PCT No.: PCT/GB2020/050284
§ 371 (c)(1),
(2) Date: Sep. 20, 2021

(87) PCT Pub. No.: WO2020/201679
PCT Pub. Date: Oct. 8, 2020

(65) Prior Publication Data
US 2022/0214390 A1 Jul. 7, 2022

(30) Foreign Application Priority Data
Mar. 29, 2019 (GB) ...................... 1904448

(51) Int. Cl.
*G01R 27/26* (2006.01)
*H01P 3/12* (2006.01)
(52) U.S. Cl.
CPC .......... *G01R 27/2664* (2013.01); *H01P 3/121* (2013.01)

(58) Field of Classification Search
CPC ..... G01R 27/26; G01R 27/2605; G06F 3/044; G06F 3/0441; G06F 3/0442;
(Continued)

(56) References Cited

U.S. PATENT DOCUMENTS 5,965,494 A * 10/1999 Terashima .............. H01P 7/088
505/700
2004/0041663 A1 3/2004 Uchimura
(Continued)

FOREIGN PATENT DOCUMENTS

| CN | 1628396 A | 6/2005 |
| CN | 1828314 A | 9/2006 |

(Continued)

OTHER PUBLICATIONS

International Search Report dated May 4, 2020 in PCT/GB2020/050284 filed on Feb. 7, 2020.
(Continued)

*Primary Examiner* — Tung X Nguyen
(74) *Attorney, Agent, or Firm* — Oblon, McClelland, Maier & Neustadt, L.L.P.

(57) ABSTRACT

A device comprises a planar substrate having conductive formations defining a substrate integrated waveguide test resonator; the test resonator comprising a three-dimensional region formed at least partly within the substrate having first and second planar conductive layers extending parallel to the plane of the substrate and one or more conductive sidewall formations perpendicular to the plane of the substrate defining a resonator side wall extending around the three-dimensional region; in which one of the first and second planar conductive layers comprises a test port comprising a conductive test connection electrically isolated from the rest of that planar conductive layer.

18 Claims, 6 Drawing Sheets

(58) Field of Classification Search
CPC .... G06F 3/0443; G06F 3/0444; G06F 3/0445; G06F 3/0446; G06F 3/0447; G06F 3/0448
See application file for complete search history.

(56) References Cited

U.S. PATENT DOCUMENTS

| | | |
|---|---|---|
| 2015/0171033 A1 | 6/2015 | Seler et al. |
| 2016/0247780 A1 | 8/2016 | Seler et al. |
| 2017/0047658 A1 | 2/2017 | Ying et al. |
| 2017/0213800 A1* | 7/2017 | Seler .................... H01L 21/568 |
| 2017/0301975 A1 | 10/2017 | Flatters et al. |

FOREIGN PATENT DOCUMENTS

| | | |
|---|---|---|
| CN | 101147072 A | 3/2008 |
| CN | 102721708 A | 10/2012 |
| CN | 103901278 A | 7/2014 |
| CN | 104865449 A | 8/2015 |
| CN | 106684520 A | 5/2017 |
| CN | 109030955 A | 12/2018 |
| CN | 109188100 A | 1/2019 |
| CN | 109239465 A | 1/2019 |
| WO | WO 2017/026082 A1 | 2/2017 |

OTHER PUBLICATIONS

Mendez-Jeronimo et al., "PCB-Substrate Characterization at Multigigahertz Frequencies Through SIW Measurements", DesignCon 2016, pp. 1-23.

* cited by examiner

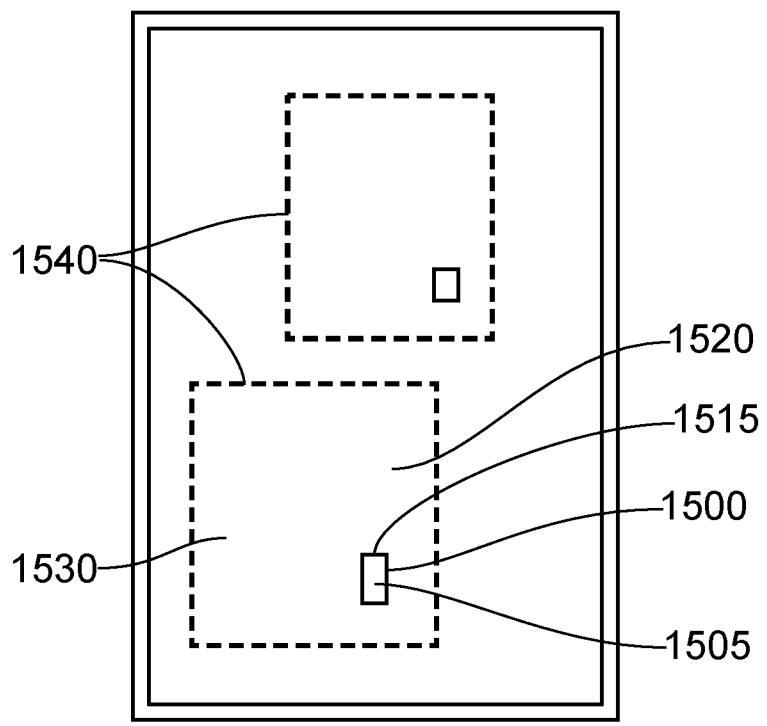
FIG. 15
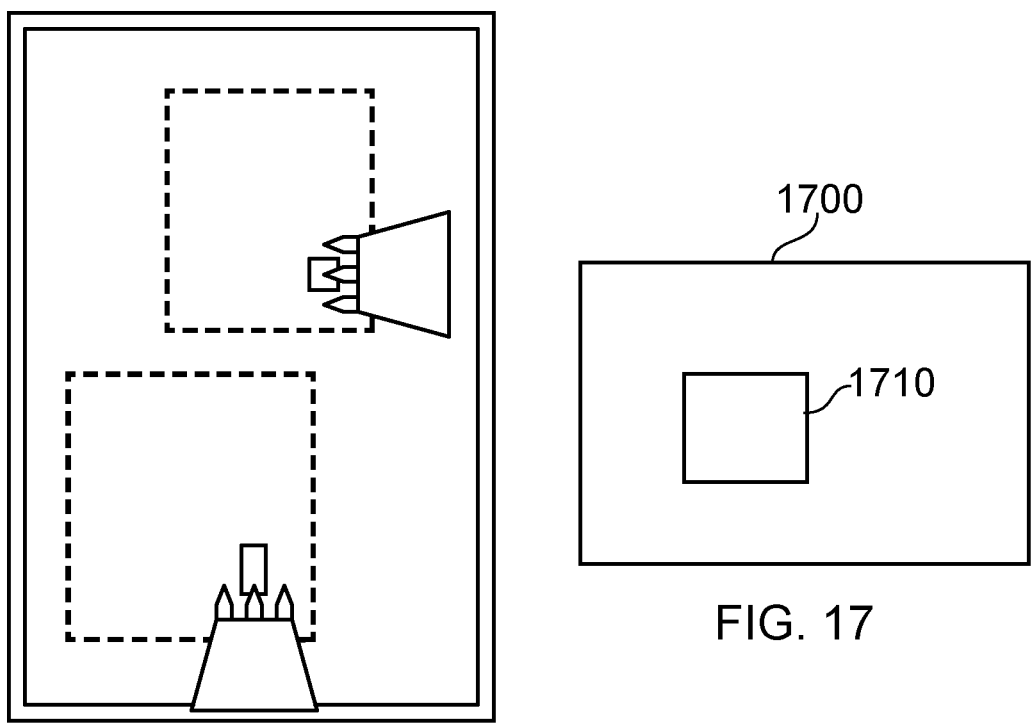
FIG. 16
FIG. 17

SUBSTRATE AND MATERIAL CHARACTERISATION METHOD AND DEVICE

BACKGROUND

Field

This disclosure relates to substrate and material characterisation methods and to devices.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, is neither expressly or impliedly admitted as prior art against the present disclosure.

Microwave or other high frequency signal processing components make use of waveguide formations to provide signal processing functions.

Where microwave or other high frequency components are provided on a substrate, their performance can depend on dielectric and other properties of the substrate. There is a need therefore to detect those properties or in other words to "characterise" the substrate or at least a material forming part (for example a layer) of a substrate.

SUMMARY

The present disclosure provides a device comprising:
a planar substrate having conductive formations defining a substrate integrated waveguide test resonator;
the test resonator comprising a three-dimensional region formed at least partly within the substrate having first and second planar conductive layers extending parallel to the plane of the substrate and one or more conductive sidewall formations perpendicular to the plane of the substrate defining a resonator side wall extending around the three-dimensional region;
in which one of the first and second planar conductive layers comprises a test port comprising a conductive test connection electrically isolated from the rest of that planar conductive layer.

The present disclosure also provides a substrate test system comprising:
a device as defined above; and
a test device connectable to the conductive test formation and to the one of the first and second planar conductive layers and comprising circuitry configured to excite electromagnetic oscillation within the test resonator, the test device being configured to characterise one or more dielectric properties of the substrate by detecting one or more resonant properties of the test resonator.

The present disclosure also provides a method comprising:
forming a test resonator in a planar substrate having conductive formations defining a substrate integrated waveguide test resonator, the test resonator comprising a three-dimensional region formed at least partly within the substrate having first and second planar conductive layers extending parallel to the plane of the substrate and one or more conductive sidewall formations perpendicular to the plane of the substrate defining a resonator side wall extending around the three-dimensional region;
forming a test port in one of the first and second planar conductive layers, comprising a test port comprising a conductive test connection electrically isolated from the rest of that planar conductive layer;
connecting a test device to the conductive test formation and to the one of the first and second planar conductive layers;
exciting electromagnetic oscillation within the test resonator; and
characterising one or more dielectric properties of the substrate by detecting one or more resonant properties of the test resonator.

Further respective aspects and features of the present disclosure are defined in the appended claims.

By way of overall summary, substrate integrated waveguide technology (SIW) is emerging as a promising technique for high frequency (for example, microwave to THz) applications. Previously proposed techniques for substrate characterization require multiple resonators, additional feeding structure with transitions, additional processing or destructive processing using a convectional SIW resonator, supporting high frequency and higher order modes are difficult. In a previously proposed SIW resonator, the feeding and resonator structures can limit higher frequency and high order mode propagation. In examples of the present technique, a single trench-filled SIW resonator is provided with a potentially simple feeding structure and capable of using a direct ground-signal-ground (GSG) coplanar waveguide (CPW) probe based calibration and measurement technique. This provides low loss at high frequency (microwave and mm wave (mmW) to THz), and also overcoming other potential shortcomings of fence-via SIW resonator based characterisation. An elegantly simple (and non-destructive) testing regime can be provided using a single trench-filled or other SIW resonator without additional feeding structure or multiple resonators provides potentially accurate ultra-wideband characterisation of microwave/millimetre-wave/THz substrates and/or materials.

Example embodiments of the present techniques claim can allow for the characterisation of a material and substrate across a wide frequency range, for example using multi-mode resonance, potentially by a single measurement on a simple SIW resonator which does not require any additional feeding structure. The technique can be used for characterizing single or multiple or all layers of a multilayer substrate, monitoring and controlling the quality of a material and hence detecting device properties during fabrication or with time/age. This can be useful, for example, to a substrate/material manufacturer to determine high frequency properties of their substrate or material.

Example embodiments, having a simple feeding structure, can be used for monitoring and controlling substrate or device property during fabrication and also in field (during operation) with time and age.

In example embodiments, the resonator can be used with a commercially available GSG probe and vector/scalar network analyser which can capture the signal in terms of scattering-parameter (S11) and determining the property or a change in property of a substrate or material and hence the properties of a high frequency component or circuit build on/in that substrate.

It is to be understood that both the foregoing general description and the following detailed description are exemplary, but are not restrictive, of the present technology.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIGS. 11-16 schematically illustrate respective examples; and

FIG. 17 schematically illustrates a device or apparatus.

DESCRIPTION OF THE PREFERRED EMBODIMENTS

Figure 1:
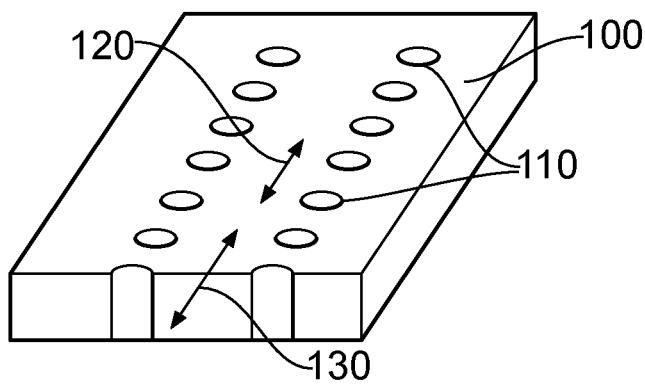
FIG. 1 schematically illustrates a stage in the fabrication of a so-called fence-post substrate integrated waveguide (SIW)

Referring now to the drawings, examples of so-called substrate integrated waveguide (SIW) components will now be described.

These components are used in, for example, applications involving frequency ranges from microwave to Terahertz (THz) ranges to provide, for example signal processing applications. In this context "microwaves" have a wavelength ranging from (say) 1 m (corresponding to a frequency of 300 MHz) to 1 mm (corresponding to a frequency of 300 GHz). So-called "THz" radiation has a frequency range generally above 300 GHz. But it will be appreciated that the particular labels applied to these frequency ranges are not exactly defined, nor are the labels technically significant in themselves. In the context of components fabricated on a substrate such as those described below, the relevant wavelength range in order to achieve reasonably dimensioned components might be, for example, from a few GHz up to 100-200 GHz or beyond into the 300 GHz+ range. The present techniques are applicable to these ranges, even if not explicitly stated in respect of each individual feature. But the present techniques are applicable outside of these ranges as well.

SIW components are characterised by fabrications which penetrate the substrate and which are filled with a conducting material such as metal in order to define sidewall formations.

FIG. 1 shows a substrate 100 which might be a single or multi-layer structure forming a dielectric substrate in which so-called fence-posts 110 are fabricated. The fence-posts are formed by boring, drilling, etching or punching holes through or into the substrate 100 and are generally close enough together (represented by a distance 120 in a waveguide propagation direction 130) so as to provide a sidewall which appears continuous to the microwave frequency in use. For example, the distance 120 may be 0.1×the wavelength in use, for example 200 μm in a component intended for use at 40 GHz. A typical depth in, say, a 40 GHz component would be 50 μm to 600 μm and a typical hole diameter in such a component would be 100 μm. In some examples, rather than using cylindrical holes, elongate (in the plane of the substrate and along the waveguide direction) formations such as spaced-apart slots can be used as the fence posts. Such arrangements can be referred to as slot-filled SIW waveguides.

These example parameters indicate that as the nominal operating frequency increases, the pitches and radii of fabricated vias forming the fence posts or slots can become very fine (including for so-called double row fence post techniques), and can therefore become difficult to realize using conventional fabrication techniques. As a result, at higher frequencies, so-called trench-filled sidewall techniques (see FIG. 3 described below) can be more appropriate for realizing a high performance component.

At a subsequent stage in fabrication, the fence posts 110 or slots are filled with metal or another conducting material to form a set of two or more conductive formations 200 spaced apart in the waveguide direction 130.

In general terms, the fence posts can be fabricated (for example for a PCB, LTCC, LCP, HTCC, high resistive Si, or glass, substrate—see below—where the holes might be fabricated by a mechanical or laser drilling process) for all of the layers, or on a layer-by layer basis, for example where the substrate is such that the holes are formed by an etching process (as an example, a silicon substrate).

Upper 210 and lower 220 conductive layers parallel to the plane of the substrate are formed, so that the metal-filled fence posts form conductive sidewall formations defining to waveguide sidewalls extending within the substrate along the waveguide direction between the upper and lower conductive layers 210, 220. Note that the terms "upper" and "lower" refer here to the orientation in the drawing and do not imply any required orientation of the component in the use. It is noted, however, that in the case of a substrate such as a printed circuit board, the posts 110 might be formed by drilling from an outer face of the printed circuit board, which would then imply that the upper layer 210 is formed on that outer layer.

Using these techniques, the upper and lower conductive layers and the conductive sidewall formations together surround a waveguide region 230 of the substrate.

Figure 3:
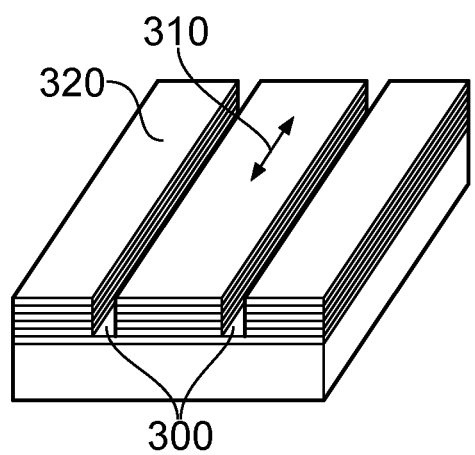
FIG. 3 schematically illustrates a stage in the fabrication of a so-called trench-filled SIW.
Figure 2:
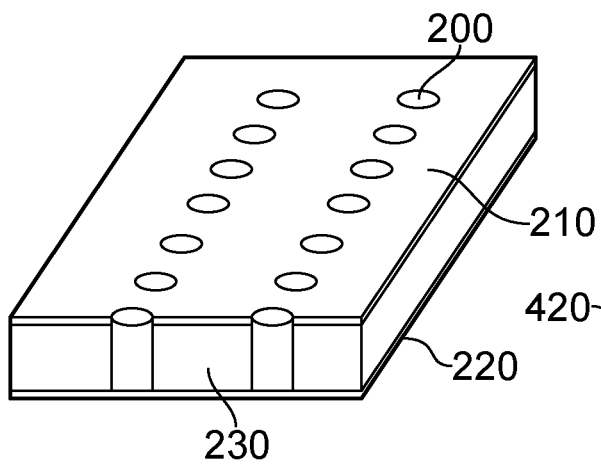
FIG. 2 schematically illustrates a later stage in the fabrication of the fence-post SIW.
Figure 4:
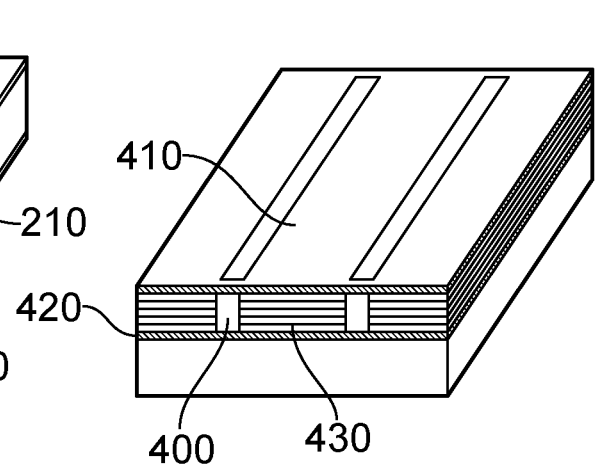
FIG. 4 schematically illustrates a later stage in the fabrication of the trench-filled SIW.

A similar arrangement is used in FIG. 3 in which so-called trench formations 300, representing longitudinal cut-away regions which are continuous in the waveguide direction 310 are formed in a dielectric substrate 320. These can be formed by, for example, etching or milling. The trenches are filled with conducting material such as metal to form at each side a conductive sidewall formation 400 extending within the substrate along the waveguide direction representing a conductive formation which is continuous in the waveguide direction. As with FIG. 2, upper 410 and lower 420 conductive layers are formed parallel to the plane of the substrate. Once again, the upper and lower conductive layers and the conductive sidewall formations 400 together define a waveguide region 430 of the substrate.

Figure 5:
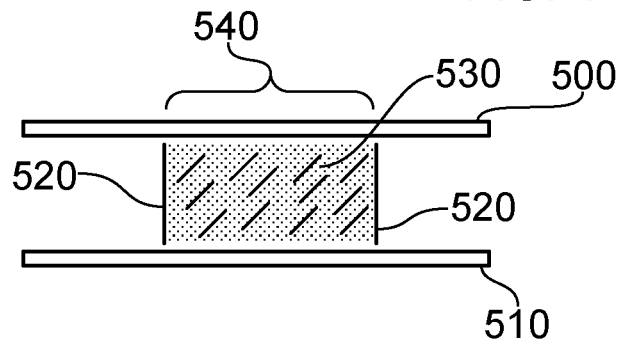
FIGS. 5 and 6 are schematic cross sections through the example SIW arrangements of FIGS. 1-4.
Figure 6:
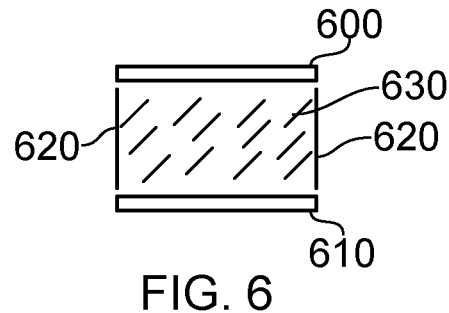

FIGS. 5 and 6 are schematic cross sections through the example SIW arrangements of FIGS. 1-4. The show the upper 500, 600 and lower 510, 610 conductive layers and the conductive sidewall formations 520, 620 which may be fence post or trench-filled, in each case surrounding a waveguide region 530, 630. In the arrangement of FIG. 5, the upper and lower conductive layers extend beyond the lateral extent 540 of the waveguide region 530, whereas in FIG. 6 the upper and lower conductive layers do not extend beyond the lateral extent of the waveguide region 630.

Note that in a practical implementation of FIGS. 5 and 6, dielectric material will extend outside of the waveguide region as shown; it is not drawn in these Figures for clarity of the diagrams.

As mentioned, the substrate may be a planar substrate formed of one or more substrate layers of a dielectric material. In the context of an SIW component of the type discussed above, there are two or more metal layers separated by one or more dielectric layers, and the first and second (upper and lower) conductive layers defining the SIW component are formed as at least respective portions of the two or more metal layers.

Suitable substrates can include a dielectric substrate, such as a substrate selected from the list consisting of: a printed circuit board (PCB); a low-temperature co-fired ceramic (LTCC) substrate, a high-temperature co-fired ceramic (HTCC) substrate; a liquid crystal polymer (LCP) substrate and a benzocyclobutene (BCB) substrate. However, it will be appreciated that other substrate materials may be used.

In other examples, a semiconductor substrate such as a silicon (Si), gallium arsenide (GaAs), gallium nitride (GaN) or indium phosphide (InP) substrate (on and in which conductive formations are fabricated) can be used.

Figure 7:
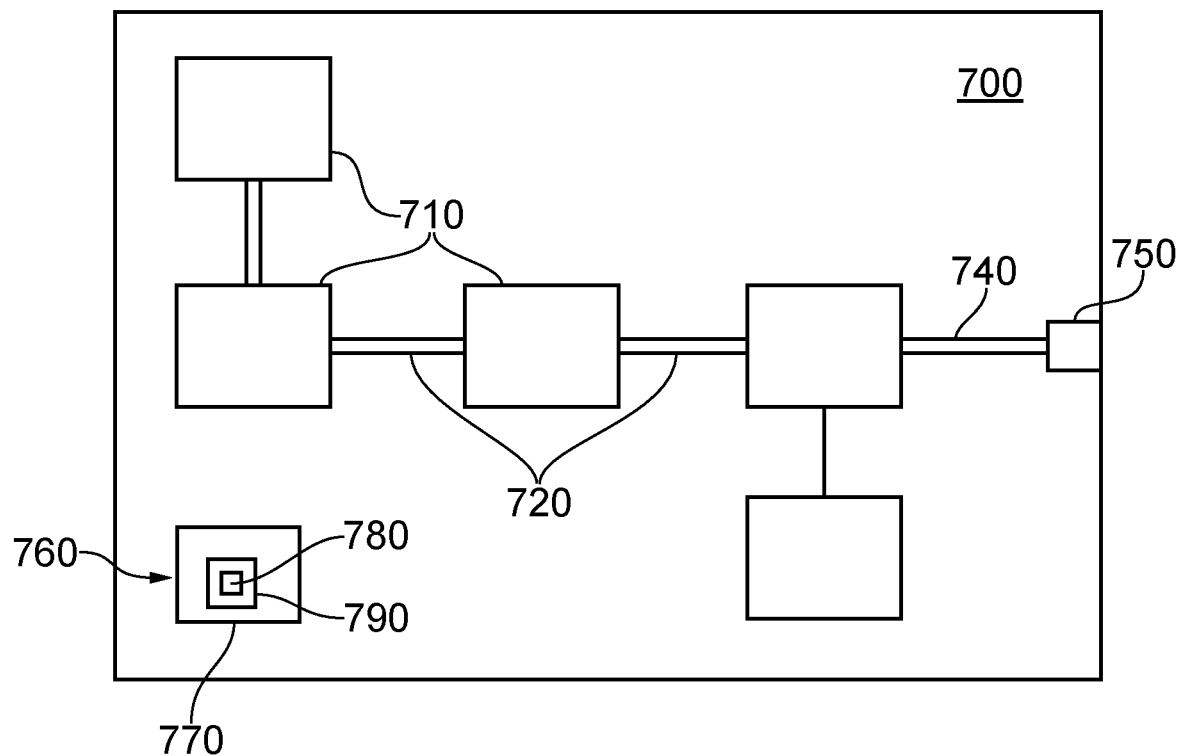
FIG. 7 schematically illustrates a substrate carrying signal processing circuitry.

FIG. 7 is a schematic plan view of signal processing circuitry comprising a dielectric substrate 700 carrying one or more high frequency (for example covering microwave to THz ranges as discussed above) signal processing components 710 linked by waveguide formations 720. In the example shown, an output signal waveguide 740 of the signal level control device is connected to an output port 750 such as a coaxial socket.

FIG. 7 also shows in schematic plan view a substrate integrated waveguide (SIW) test resonator 760. The test resonator 760 is formed in the planar substrate by conductive formations using the SIW techniques discussed above. That is to say, the test resonator comprises a three-dimensional region formed at least partly within the substrate 700 having first and second (upper and lower using the terminology of FIGS. 1-6) planar conductive layers extending parallel to the plane of the substrate and one or more conductive sidewall formations (such as fence-post and/or trench-filled sidewall formations) perpendicular to the plane of the substrate defining a resonator side wall extending around the three-dimensional region. In FIG. 7, the representation is a plan view so the first and second planar conductive layers are at different depths relative to the plane of the drawing. The path of the one or more conductive sidewall formations is shown as an outline 770.

Figure 8:
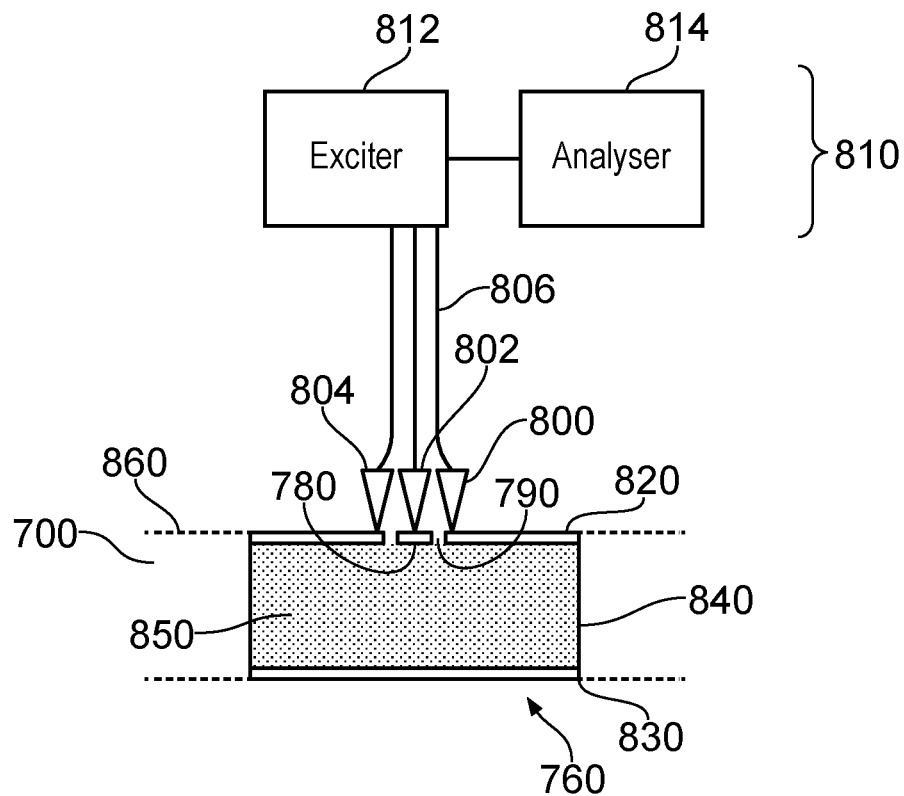
FIG. 8 schematically illustrates a test resonator and a connection to a test probe.

FIG. 8 schematically shows the test resonator in cross-section, connected to a test probe 800 such as a GSG probe which is in turn connected to test apparatus 810. In FIG. 8, the first 820 and second 830 planar conductive layers are shown along with the one or more conductive sidewall formations 840 and the three-dimensional region 850. A dotted line 860 shows the outline of the upper or outer surface of the substrate 700. Note that following the discussion of FIGS. 5 and 6, the planar conductive layers could extend laterally beyond the extent shown as 820, 830 in FIG. 8, but for the purposes of the operation of the test resonator, any extension of the planar conductive layers beyond the limits defined by the one or more conductive sidewall formations is substantially irrelevant to the technical operation of the test resonator.

Referring to FIGS. 7 and 8, one of the first and second planar conductive layers, being the uppermost layer 820 as drawn in FIG. 8, comprises a test port 780. The test port 780 comprises a conductive test connection electrically isolated from the rest of that planar conductive layer, which is grounded, for example by the GSG probe. So, a gap or aperture 790 in the upper planar conductive layer is provided around the conductive test connection forming the test port.

In FIGS. 7 and 8, the three-dimensional region is shown as a rectangular parallelepiped formation, in that the plan view of the one or more conductive sidewall formations is rectangular and the upper and lower conductive layers 820, 830 are rectangular and overlie one another. Indeed, in a test resonator in which the conductive sidewall formations are perpendicular to the plane of the substrate, the result will naturally be an upper and lower planar conductive layer which overlie one another. Note however that different shapes of test resonator could be used, in that the plan view of the one or more conductive sidewall formations could represent a circular, curved, oval, multi-sided (polygonal) or other closed shape, with the upper and lower planar conductive layers adopting the same shape so as to define the three-dimensional region as a closed region other than by the aperture 790 in which the conductive test connection 780 is formed.

Again, the aperture 790 and the conductive test connection 780 are each shown as rectangular in shape in FIG. 7, but there is no technical requirement for this particular shape and different shapes such as circular, oval, polygonal or other shapes could be used for one or both of the aperture 790 and the conductive test connection 780.

The test probe 800 comprises a coplanar waveguide (CPW) arrangement of a central signal probe 802 and two outer earth probes 804 and 805, connected to a coaxial connector 806 (which can be formed, for example, as a cable for lower frequency use or rectangular waveguide structure for higher frequency use) having a central signal conductor and outer screening earth conductors. The signal probe 802 and the earth probes 804 may be formed as needles or other metal formations having sharp points which can be pressed down onto the test port 780 (the conductive test connection within the aperture 790) in the case of the central signal probe 802 and onto surrounding portions of the upper planar conductive layer 820 in the case of the outer earth probes 804. So, the establishment of an electrical connection between the test probe 800 and the test resonator 760 simply requires the test probe 800 to be placed or pressed onto the test resonator so that the central signal probe 802 makes contact with the conductive test connection and the outer earth probes 804 may contact with the remainder of the upper planar conductive layer 820.

The test resonator is electrically isolated from the remaining one or more signal processing components 710 on the substrate 700 of FIG. 7. Therefore, its resonant characteristics are independent of the other signal processing components but are dependent upon the dielectric properties of the substrate 700.

Techniques for characterising the dielectric properties of the substrate 700 will be discussed in more detail with reference to FIGS. 9 and 10 below, but in brief the test apparatus 810 comprises an exciter 812 to excite electromagnetic oscillation within the test resonator 760 and an analyser 814 to analyse the spectral content of the excited electrical oscillation.

Examples of this type of operation are disclosed by the paper "An SOLR Calibration For Accurate Measurement Of Orthogonal On-Wafer DUTS", Basu et al, IEEE MTT-S International Microwave Symposium, June 1997; and "Pure-Mode Network Analyzer for On-Wafer Measurements of Mixed-Mode S-Parameters of Differential Circuits", Bockelman et al, IEEE Transactions On Microwave Theory And Techniques, Vol. 45, NO. 7, July 1997, the contents of each of which are hereby incorporated by reference.

Within a closed (or at least substantially closed, apart from the aperture 790) three-dimensional region or cavity forming the test oscillator, electromagnetic oscillation of one or more so-called orders or cavity modes can be excited. The oscillations may be so-called transverse electrical (TE) oscillations, with the orders of oscillation being defined by a mode designation $TE_{m,n,p}$, where (m,n,p) represent the number of half waves of the electric field in the (x, y, z) coordinate directions and can each be zero or any positive integer. For substrate integrated waveguide, due to thinness of substrate, excited modes are in fact $TE_{m,n}$ (m/n are positive integers, and p=0 so that the modes are referred to as $TE_{m,n}$). By exciting the cavity forming the test resonator 760, the resulting distribution of energy amongst the different $TE_{m,n}$ modes, resonant frequencies, and quality factors can be analysed by the analyser 814 to characterise one or more electrical or RF properties such as permittivity, permeability and loss tangent of the substrate 700. A commercially available a high frequency signal source can be used as an exciter and an S-parameter test set as analyser.

Figure 9:
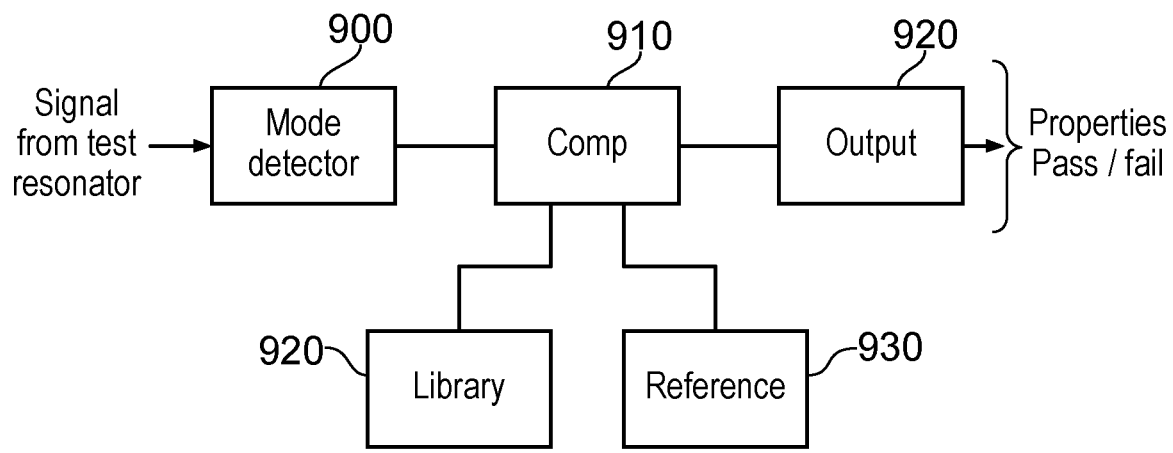
FIG. 9 schematically illustrates a test apparatus.

FIG. 9 schematically illustrates test apparatus, forming part of a test device, and in particular shows an example arrangement of the analyser 814 of FIG. 8, in which a mode detector 900 receives the signal return from the test resonator 760 via the connector 806 or rectangular waveguide and detects those $TE_{m,n}$ modes currently excited by the excitation signal currently provided by the exciter 812 within the cavity defined by the test resonator 760. A comparator 910 compares the signal levels in each mode and/or the ratio of intensity between the different modes with one or both of a library 920 of standardised results or ratios and data 930 indicating a previous or reference measurement against which the current example of the substrate 700 is being compared. The use of the reference data 930 can allow the present techniques to be used in a quality assurance (monitoring and controlling quality during fabrication process) application servers to check that successive batches of substrate formed using the same technique maintain the same dielectric properties, also to cross check the quality during operation in filed and with time/age Output circuitry 920 generates an output indicative of the detection made by the comparator 910, for example a set of data indicative of properties such as permittivity, permeability and/or loss tangent, or a pass/fail output indicating whether the current example of the substrate 700 is within an acceptable margin of the properties defined by the reference data 930.

Various properties of the resonance of the test resonator can be analysed in this way. For example, the one or more resonant properties to be analysed can comprise one or more properties (including their ratios) selected from the list consisting of:

one or more resonant frequencies of the test resonator;
one or more cavity modes excited in the test resonator; and
a resonance quality factor of the test resonator.

Therefore, FIG. 7 shows an example of a test system comprising:

a device (a substrate 700 in which a test resonator 760 is formed); and
a test device 800, 810 connectable to the conductive test formation and to the one of the first and second planar conductive layers and comprising circuitry configured to excite electromagnetic oscillation within the test resonator, the test device being configured to characterise one or more dielectric properties of the substrate or that for a single or multiple layers for a multilayer substrate by detecting one or more resonant properties of the test resonator. Due to excitation of multiple higher order modes/resonance, a single resonator can characterise a substrate or material for a wide frequency range.

By providing the test resonator on the substrate itself, electrically isolated from other components, a non-destructive and advantageously straightforward method of testing each individual substrate and dielectric layers can easily be provided without significant overhead in terms of substrate space or manufacturing cost. In, for example, a system intended to operate at a frequency of approximately 40 GHz, the typical dimensions of a rectangular parallelepiped test resonator might be of sides 1.5 mm×1.75 mm (on a ceramic substrate), so the amount of substrate area occupied by the test resonator is considered relatively small compared to the benefit of being able to test the dielectric properties of each instance of a substrate.

Further, as frequency increases, the size of a resonator decreases. The coupled signal level for an order of the excitation mode ($TE_{m,n}$) can be controlled by optimizing the position and the dimension of the test port (780, 790). And the fundamental resonance frequency of a resonation can be decided by varying the dimensions of 780 and 790.

The apparatus of FIG. 9 may be implemented as software-controlled data processing apparatus.

Figure 10:
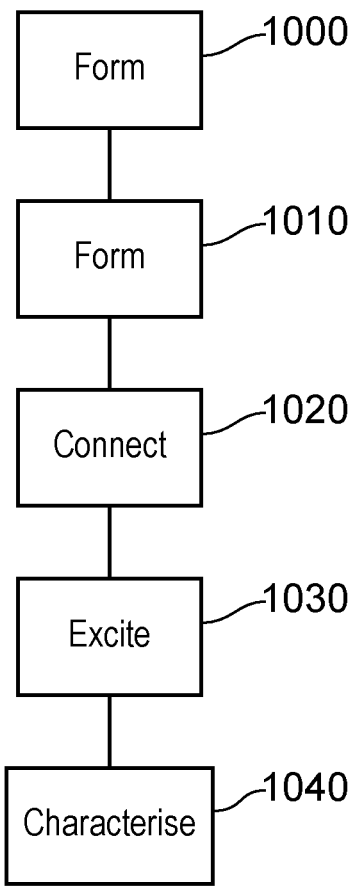
FIG. 10 is a schematic flowchart representing a method.

FIG. 10 is a schematic flowchart illustrating a substrate test method comprising:

forming (at a step 1000) a test resonator (such as the test resonator 760) in a planar substrate (for example, 700) having conductive formations defining a substrate integrated waveguide test resonator, the test resonator comprising a three-dimensional region formed at least partly within the substrate having first and second planar conductive layers extending parallel to the plane of the substrate and one or more conductive sidewall formations perpendicular to the plane of the substrate defining a resonator side wall extending around the three-dimensional region;

forming (at a step 1010) a test port 780 in one of the first and second planar conductive layers, comprising a test port comprising a conductive test connection electrically isolated from the rest of that planar conductive layer;

connecting (at a step 1020) a test device 800, 810 to the conductive test formation and to the one of the first and second planar conductive layers;

exciting (at a step 1030) electromagnetic oscillation within the test resonator; and characterising (at a step 1040) one or more dielectric properties of the substrate by detecting one or more resonant properties, such as resonance frequency and quality factor, of the test resonator.

Further examples will now be described with reference to FIGS. 11-16.

Figure 11:
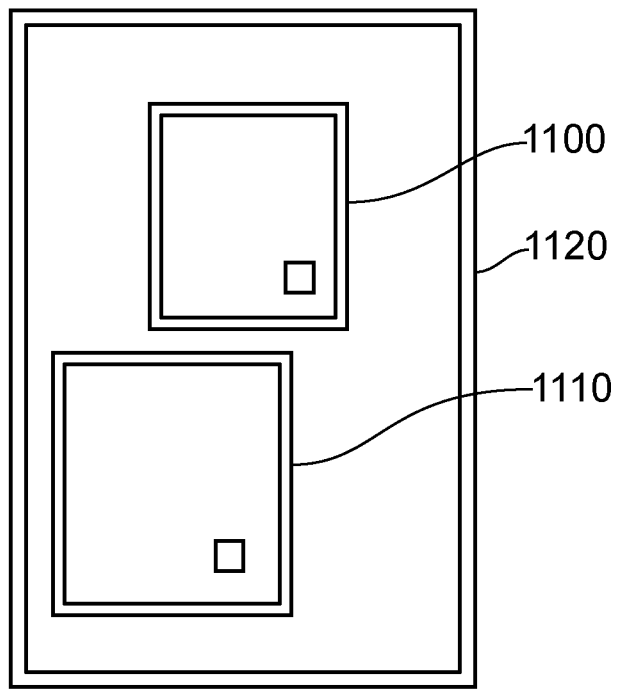

FIG. 11 provides a schematic plan view of a pair of resonators 1100, 1110 on a substrate 1120. Each of the resonators 1100, 1110 may be of the form described above with reference to the resonator 760 and provides a test port in an upper planar conductive layer (as drawn) comprising a conductive test connection electrically isolated from the rest of that planar conductive layer. In FIG. 11, two test resonators are shown. Some examples may provide, only one. Other components and circuitry (not shown in FIG. 11) may be provided on the substrate 1120. The test port for each resonator may be central with respect to the plan view of the resonator or may be displaced from the centre (as drawn in FIG. 11).

Figure 12:
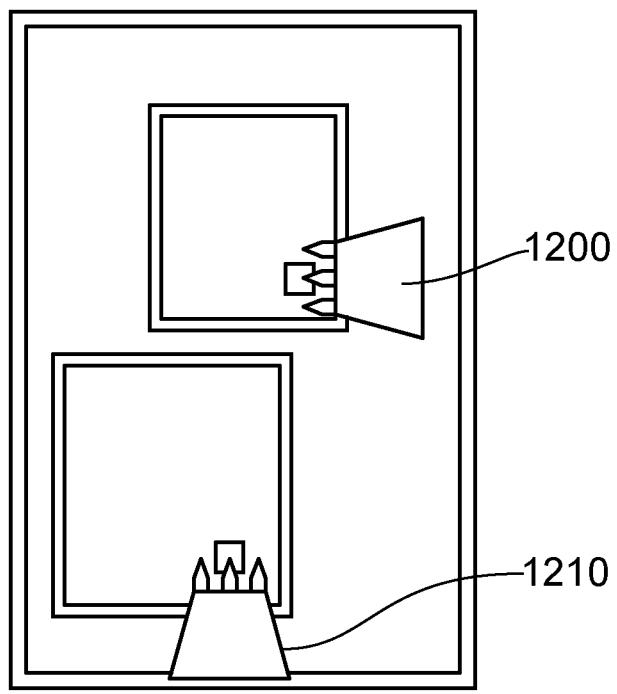

In FIG. 12, a GSG probe is applied to each test port, so that a central conductor of the probe contacts the conductive test connection (at the centre of the test port as drawn) and the other two conductors of the GSG probe contact the upper planar conductive layer. The GSG probes 1200, 1210 are drawn schematically, but a real embodiment may be arranged so as to approach the respective test ports perpendicular to the plane of the drawing. The GSG test probes may be connected to suitable analysis apparatus as described above.

Figure 13:
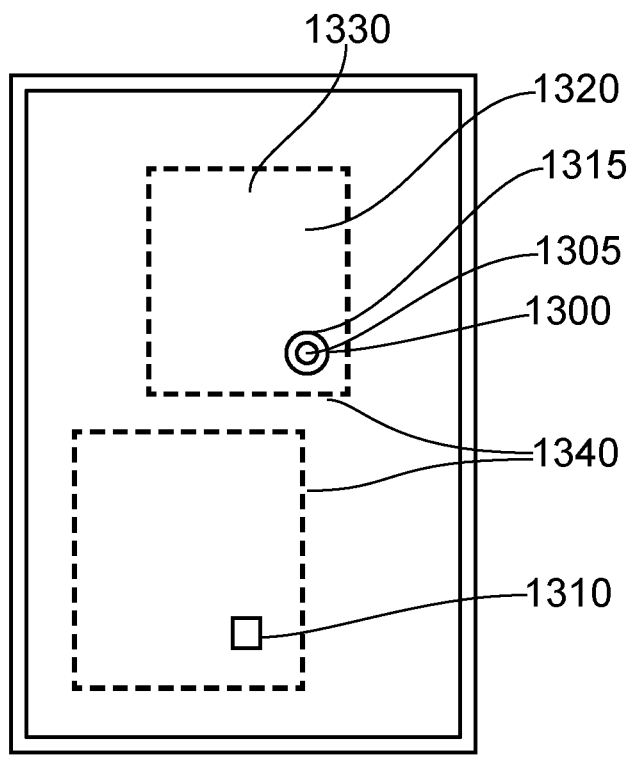
Figure 14:
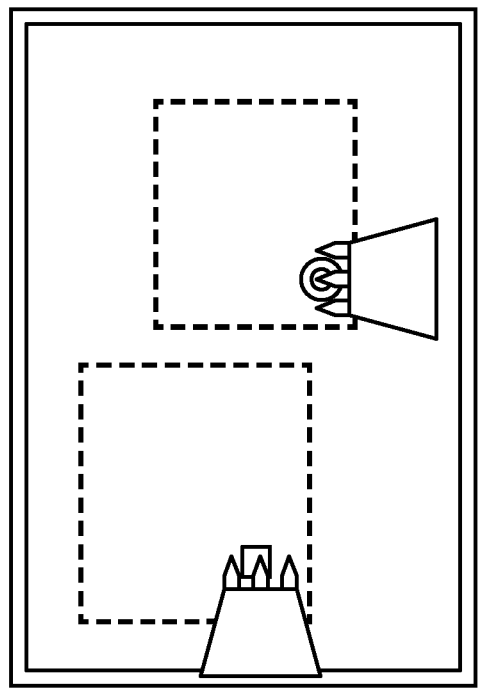

The example of FIGS. 11 and 12 uses a trench-filled SIW structure to define the test resonator, as indicated schematically by the solid outline of the plan view of the test resonator. FIGS. 13 and 14 schematically represent arrangements identical to those of FIGS. 11 and 12 respectively, but with two main differences:
(a) one of the test ports 1300 is drawn as a circular conductor 1305 electrically isolated by an annular insulating region or gap 1315 from the remainder 1320 of the upper planar conductive layer of the test resonator 1330; and
(b) the outer wall 1340 of each of the example SIW test resonators in FIG. 13 is fabricated by a fence-post technique as discussed above.

As before, FIG. 14 schematically represents the test resonators of FIG. 13 being probed by example GSG probes.

The example of FIGS. 11 and 12 uses a trench-filled SIW structure to define the test resonator, as indicated schematically by the solid outline of the plan view of the test resonator.

FIGS. 15 and 16 schematically represent arrangements identical to those of FIGS. 11 and 12 respectively, but with two main differences:
(a) one of the test ports 1500 is drawn as an elongate rectangular conductor 1505 electrically isolated by a rectangular insulating region or gap 1515 from the remainder 1520 of the upper planar conductive layer of the test resonator 1530; and
(b) the outer wall 1540 of each of the example SIW test resonators in FIG. 15 is fabricated by a slot-filled technique as discussed above.

As before, FIG. 16 schematically represents the test resonators of FIG. 15 being probed by example GSG probes.

The square, circular and rectangular test port examples shown above provide an illustration that various different shapes (not limited to these three examples) are possible.

Note that it is not a requirement to use a GSG probe. Instead, for example, a GS (ground signal) probe, having one connection to the test conductor of the test port and another connection to the upper planar conductive layer, could be used.

The arrangements of any of FIGS. 11, 13 and 15 can be used as (or as a part 1710 of) a device or apparatus 1700 of FIG. 17, such as one or more of a mobile communications base station, a radar apparatus, an Internet of Things (IoT) device, a satellite payload device, a mobile telecommunications device or handset or the like.

In so far as embodiments of the disclosure have been described as being implemented, at least in part, by software-controlled data processing apparatus, it will be appreciated that a non-transitory machine-readable medium carrying such software, such as an optical disk, a magnetic disk, semiconductor memory or the like, is also considered to represent an embodiment of the present disclosure. Similarly, a data signal comprising coded data generated according to the methods discussed above (whether or not embodied on a non-transitory machine-readable medium) is also considered to represent an embodiment of the present disclosure.

It will be apparent that numerous modifications and variations of the present disclosure are possible in light of the above teachings. It is therefore to be understood that within the scope of the appended clauses, the technology may be practised otherwise than as specifically described herein.

It will be appreciated that the above description for clarity has described embodiments with reference to different functional units, circuitry and/or processors. However, it will be apparent that any suitable distribution of functionality between different functional units, circuitry and/or processors may be used without detracting from the embodiments. Described embodiments may be implemented in any suitable form including hardware, software, firmware or any combination of these. Described embodiments may optionally be implemented at least partly as computer software running on one or more data processors and/or digital signal processors. The elements and components of any embodiment may be physically, functionally and logically implemented in any suitable way. Indeed the functionality may be implemented in a single unit, in a plurality of units or as part of other functional units. As such, the disclosed embodiments may be implemented in a single unit or may be physically and functionally distributed between different units, circuitry and/or processors.

Although the present disclosure has been described in connection with some embodiments, it is not intended to be limited to the specific form set forth herein. Additionally, although a feature may appear to be described in connection with particular embodiments, one skilled in the art would recognize that various features of the described embodiments may be combined in any manner suitable to implement the technique.

Respective aspects and features are defined by the following numbered clauses:

1. A device comprising:
a planar substrate having conductive formations defining a substrate integrated waveguide test resonator;
the test resonator comprising a three-dimensional region formed at least partly within the substrate having first and second planar conductive layers extending parallel to the plane of the substrate and one or more conductive sidewall formations perpendicular to the plane of the substrate defining a resonator side wall extending around the three-dimensional region;
in which one of the first and second planar conductive layers comprises a test port comprising a conductive test connection electrically isolated from the rest of that planar conductive layer.

2. A device according to clause 1, in which the three-dimensional region is a rectangular parallelepiped formation, the first and second planar conductive layers being rectangular conductive layers.

3. A device according to clause 1 or clause 2, in which the test port comprises an aperture formed in one of the first and second planar conductive layers, the conductive test connection being formed within the aperture.

4. A device according to clause 3, in which the aperture is a rectangular aperture.

5. A device according to clause 3 or clause 4, in which the conductive test connection is a rectangular test connection.

6. A device according to any one of the preceding clauses, in which the substrate is formed of one or more layers of a dielectric material.

7. A device according to clause 6, in which:
the substrate comprises a dielectric board having two or more metal layers separated by one or more dielectric layers; and
the first and second conductive layers defining the test resonator are formed as at least respective portions of the two or more metal layers.

8. A device according to clause 7, in which the substrate comprises a dielectric substrate selected from the list consisting of:
(i) a printed circuit board;
(ii) a low-temperature co-fired ceramic (LTCC) substrate;
(iii) a high temperature co-fired ceramic (HTCC) substrate;
(iv) a liquid crystal polymer (LCP) substrate and
(v) a benzocyclobutene (BCB) substrate.

9. A signal level control device according to any one of clauses 1 to 5, in which the substrate comprises a semiconductor substrate.

10. A signal level control device according to clause 9, in which the semiconductor substrate is a silicon (Si), GaAs, GaN or InP substrate.

11. A device according to clause 2, in which the one or more conductive sidewall formations comprise one of:
(i) two or more conductive formations spaced along a sidewall path;
(ii) a conductive formation which is continuous along the sidewall path.

12. Signal processing circuitry comprising a dielectric substrate carrying one or more signal processing components, in which a test resonator according to any one of the preceding clauses is formed at least partly within the dielectric substrate.

13. Signal processing circuitry according to clause 10, in which the test resonator is electrically isolated from the one or more signal processing components.

14. A mobile communications base station, a radar apparatus, an Internet of Things (IoT) device, a satellite payload device or a mobile telecommunications device or handset comprising signal processing circuitry according to any one of clauses 12 and 13.

15. A substrate test system comprising:
a device according to any one of clauses 1 to 11; and
a test device connectable to the conductive test formation and to the one of the first and second planar conductive layers and comprising circuitry configured to excite electromagnetic oscillation within the test resonator, the test device being configured to characterise one or more dielectric properties of the substrate by detecting one or more resonant properties of the test resonator.

16. A system according to clause 15, in which the one or more resonant properties comprise one or more properties selected from the list consisting of:
one or more resonant frequencies of the test resonator;
one or more cavity modes excited in the test resonator; and
a resonance quality factor of the test resonator.

17. A method comprising:
forming a test resonator in a planar substrate having conductive formations defining a substrate integrated waveguide test resonator, the test resonator comprising a three-dimensional region formed at least partly within the substrate having first and second planar conductive layers extending parallel to the plane of the substrate and one or more conductive sidewall formations perpendicular to the plane of the substrate defining a resonator side wall extending around the three-dimensional region;
forming a test port in one of the first and second planar conductive layers, comprising a test port comprising a conductive test connection electrically isolated from the rest of that planar conductive layer;
connecting a test device to the conductive test formation and to the one of the first and second planar conductive layers;
exciting electromagnetic oscillation within the test resonator; and
characterising one or more dielectric properties of the substrate by detecting one or more resonant properties of the test resonator.

The invention claimed is:

1. A device, comprising:
a planar substrate having conductive formations defining a substrate integrated waveguide test resonator, the test resonator comprising a three-dimensional region formed at least partly within the substrate having first and second planar conductive layers extending parallel to a plane of the substrate and one or more conductive sidewall formations perpendicular to the plane of the substrate defining a resonator side wall extending around the three-dimensional region,
wherein one planar conductive layer of the first and second planar conductive layers includes a test port comprising a conductive test connection electrically isolated from a rest of the one planar conductive layer, and
wherein the test port comprises an aperture formed in the one planar conductive layer, the conductive test connection being formed entirely within the aperture with a gap between the conductive test connection and the rest of the one planar conductive layer.

2. The device according to claim 1, wherein the three-dimensional region is a rectangular parallelepiped formation, the first and second planar conductive layers being rectangular conductive layers.

3. The device according to claim 2, wherein the one or more conductive sidewall formations comprise one of:
(i) two or more conductive formations spaced along a sidewall path; and
(ii) a conductive formation which is continuous along the sidewall path.

4. The device according to claim 1, wherein the aperture is a rectangular aperture.

5. The device according to claim 1, wherein the conductive test connection is a rectangular test connection.

6. The device according to claim 1, wherein the substrate is formed of one or more layers of a dielectric material.

7. The device according to claim 6, wherein:
the substrate comprises a dielectric board having two or more metal layers separated by one or more dielectric layers; and
the first and second conductive layers defining the test resonator are formed as at least respective portions of the two or more metal layers.

8. The device according to claim 7, wherein the substrate comprises a dielectric substrate selected from a list consisting of:
(i) a low-temperature co-fired ceramic (LTCC) substrate;

(ii) a high temperature co-fired ceramic (HTCC) substrate;
(iii) a liquid crystal polymer (LCP) substrate; and
(iv) a benzocyclobutene (BCB) substrate.

9. The device according to claim 7, wherein the substrate comprises a dielectric substrate which is a printed circuit board.

10. The device according to claim 1, wherein the substrate comprises a semiconductor substrate.

11. The device according to claim 10, wherein the semiconductor substrate is a silicon (Si) substrate.

12. The device according to claim 10, wherein the semiconductor substrate is a GaAs, GaN, or InP substrate.

13. A substrate test system, comprising:
the device according to claim 1; and
a test device connectable to the conductive test connection and to the one planar conductive layer of the first and second planar conductive layers and comprising circuitry configured to excite electromagnetic oscillation within the test resonator, the test device being configured to characterize one or more dielectric properties of the substrate by detecting one or more resonant properties of the test resonator.

14. The system according to claim 13, wherein the one or more resonant properties comprise one or more properties selected from a list consisting of:
one or more resonant frequencies of the test resonator;
one or more cavity modes excited in the test resonator; and
a resonance quality factor of the test resonator.

15. A signal processing device, comprising:
a dielectric substrate including one or more signal processing components; and
a test resonator formed at least partly within the dielectric substrate,
wherein the substrate includes conductive formations defining a substrate integrated waveguide test resonator, the test resonator comprising a three-dimensional region formed at least partly within the substrate having first and second planar conductive layers extending parallel to a plane of the substrate and one or more conductive sidewall formations perpendicular to the plane of the substrate defining a resonator side wall extending around the three-dimensional region,
wherein one planar conductive layer of the first and second planar conductive layers includes a test port comprising a conductive test connection electrically isolated from a rest of the one planar conductive layer.

16. The signal processing device according to claim 15, wherein the test resonator is electrically isolated from the one or more signal processing components.

17. A mobile communications base station, a radar apparatus, an Internet of Things (IoT) device, a satellite payload device, or a mobile telecommunications device or handset comprising the signal processing device according to claim 15.

18. A method comprising:
forming a test resonator in a planar substrate having conductive formations defining a substrate integrated waveguide test resonator, the test resonator comprising a three-dimensional region formed at least partly within the substrate having first and second planar conductive layers extending parallel to the plane of the substrate and one or more conductive sidewall formations perpendicular to the plane of the substrate defining a resonator side wall extending around the three-dimensional region;
forming a test port in one of the first and second planar conductive layers, comprising a test port comprising a conductive test connection electrically isolated from the rest of that planar conductive layer;
connecting a test device to the conductive test formation and to the one of the first and second planar conductive layers;
exciting electromagnetic oscillation within the test resonator; and
characterising one or more dielectric properties of the substrate by detecting one or more resonant properties of the test resonator.

\* \* \* \* \*